United States Patent [19]
Zielke

[11] Patent Number: 5,913,699
[45] Date of Patent: Jun. 22, 1999

[54] LAMINATED SPRING STRUCTURE AND FLEXIBLE CIRCUITRY CONNECTOR INCORPORATING SAME

[75] Inventor: Henry Zielke, Hoffman Estates, Ill.

[73] Assignee: Molex Incorporated, Lisle, Ill.

[21] Appl. No.: 08/963,298

[22] Filed: Nov. 3, 1997

[51] Int. Cl.⁶ ................................................ H01R 9/09
[52] U.S. Cl. .......................................... 439/632; 439/267
[58] Field of Search ............................... 439/67, 62, 260, 439/267, 63

[56] References Cited

U.S. PATENT DOCUMENTS

| | | | |
|---|---|---|---|
| Re. 33,604 | 6/1991 | Gillett et al. ............................... | 439/62 |
| 3,526,869 | 9/1970 | Conrad et al. ........................... | 439/260 |
| 3,793,609 | 2/1974 | McIver ..................................... | 439/267 |
| 3,922,054 | 11/1975 | Dechelette ................................ | 439/67 |
| 4,176,900 | 12/1979 | Hines et al. ............................. | 439/260 |
| 4,327,955 | 5/1982 | Minter ..................................... | 439/260 |
| 4,577,922 | 3/1986 | Stipanuk et al. ......................... | 439/629 |
| 4,626,056 | 12/1986 | Andrews, Jr. et al. .................. | 439/260 |
| 4,629,270 | 12/1986 | Andrews, Jr. et al. .................. | 439/260 |
| 4,636,019 | 1/1987 | Gillett et al. ............................... | 439/62 |
| 4,780,093 | 10/1988 | Walse et al. ............................. | 439/418 |
| 4,894,022 | 1/1990 | Guckenheimer ........................ | 439/260 |
| 5,098,309 | 3/1992 | Deak et al. .............................. | 439/260 |
| 5,308,257 | 5/1994 | Buchter et al. .......................... | 439/267 |
| 5,496,182 | 3/1996 | Yasumura ................................ | 439/67 |
| 5,622,505 | 4/1997 | Hashiguchi et al. ...................... | 439/67 |

Primary Examiner—Neil Abrams
Assistant Examiner—T C Patel
Attorney, Agent, or Firm—A. A. Tirva

[57] ABSTRACT

A flexible circuitry connector includes an improved contact spring assembly that is compared with a plurality of discrete spring elements arranged longitudinally along the connector. Flexible circuitry is supported by the spring elements and held against a circuit card by each such spring element in a manner such that the spring elements apply a series of discrete contact forces for the length of the spring assembly, thereby eliminating any problems due to circuit card thickness variations and warpage as well as other compliance issues.

35 Claims, 9 Drawing Sheets

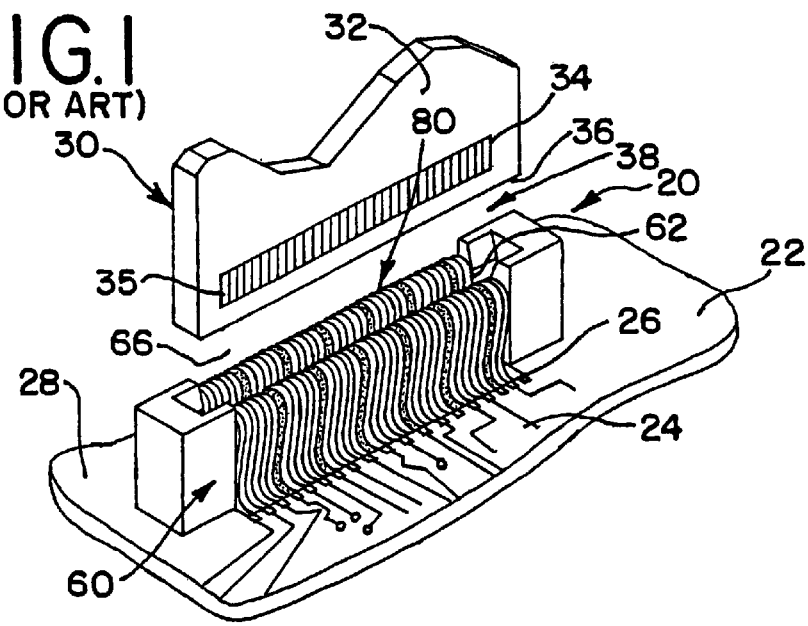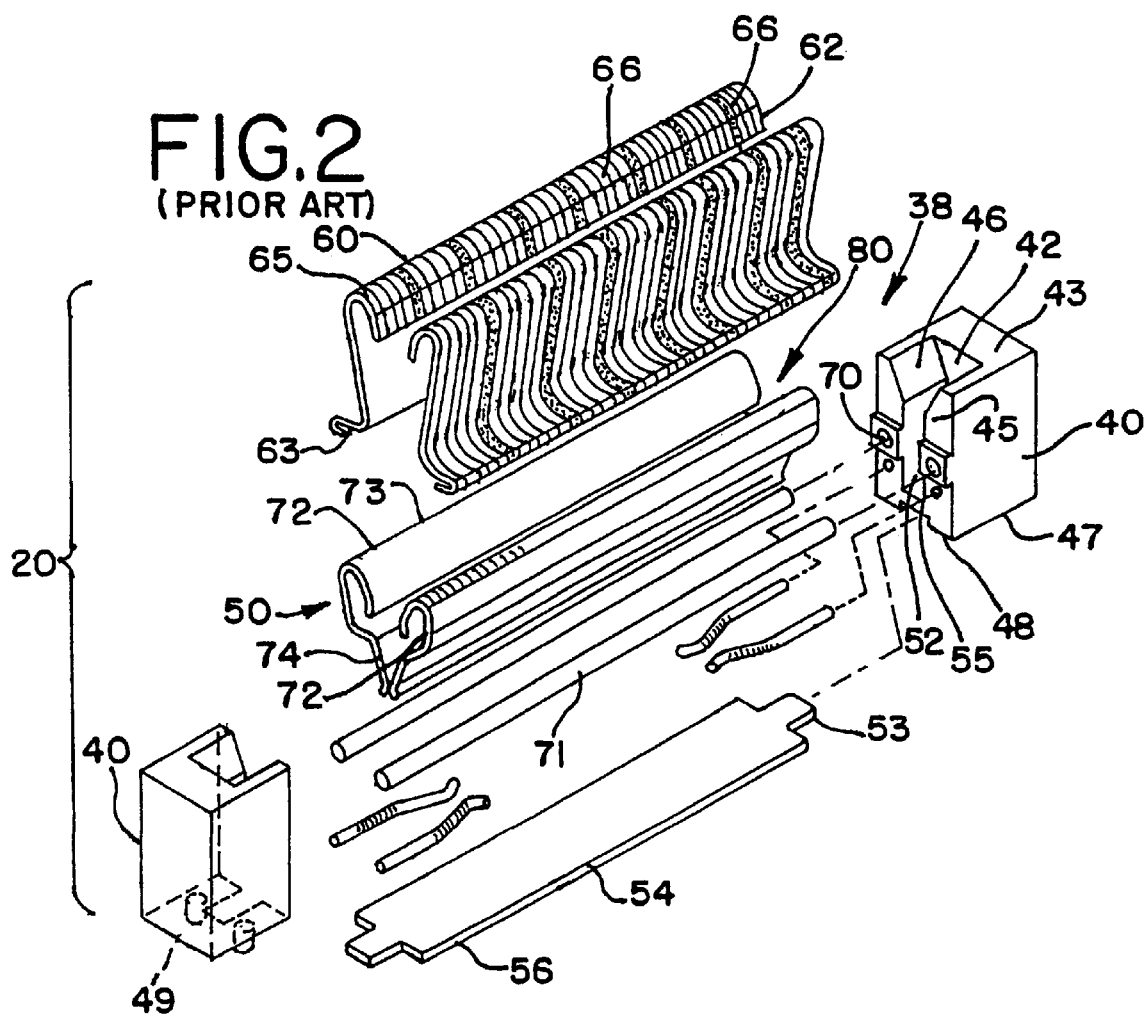

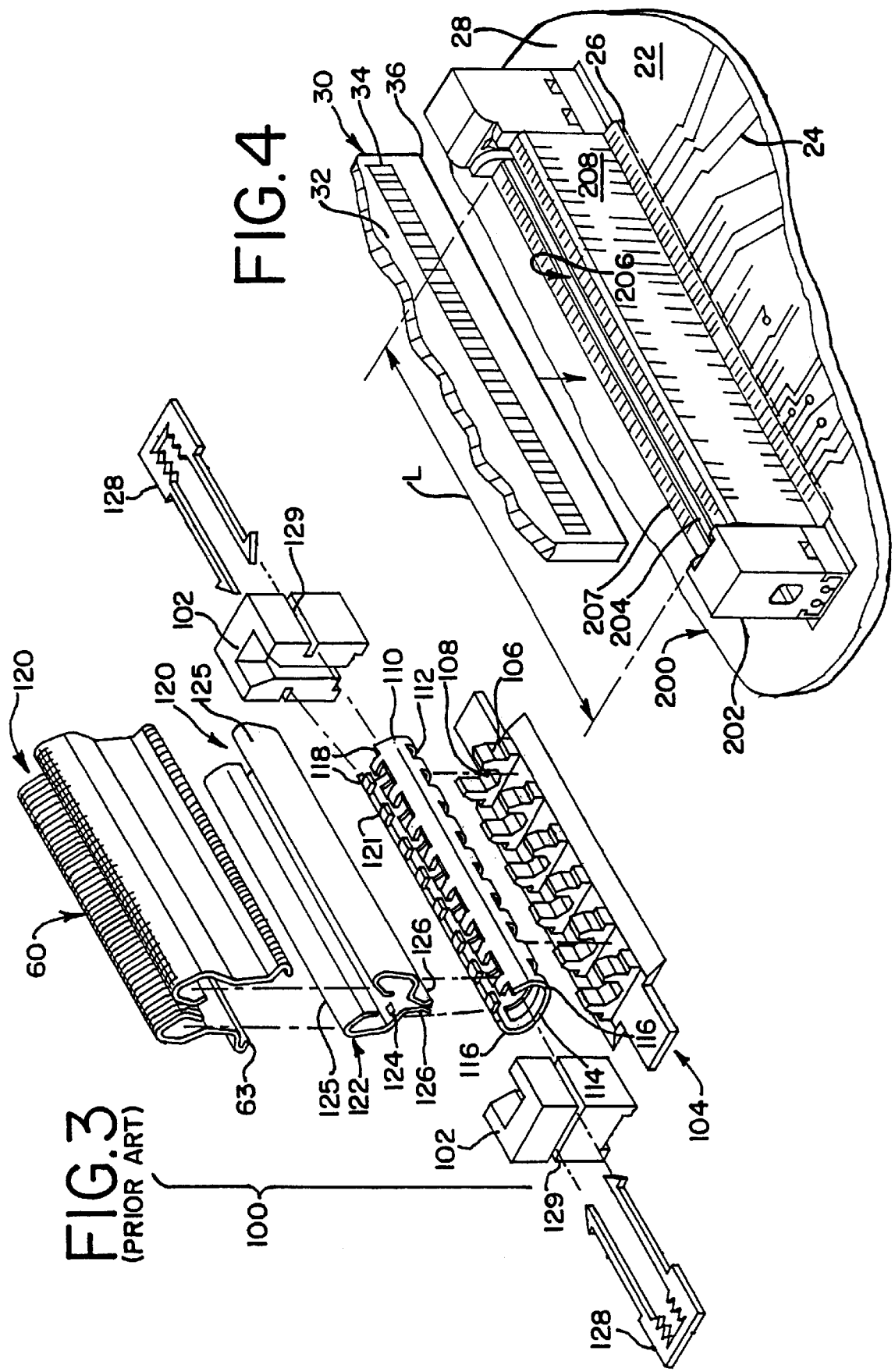

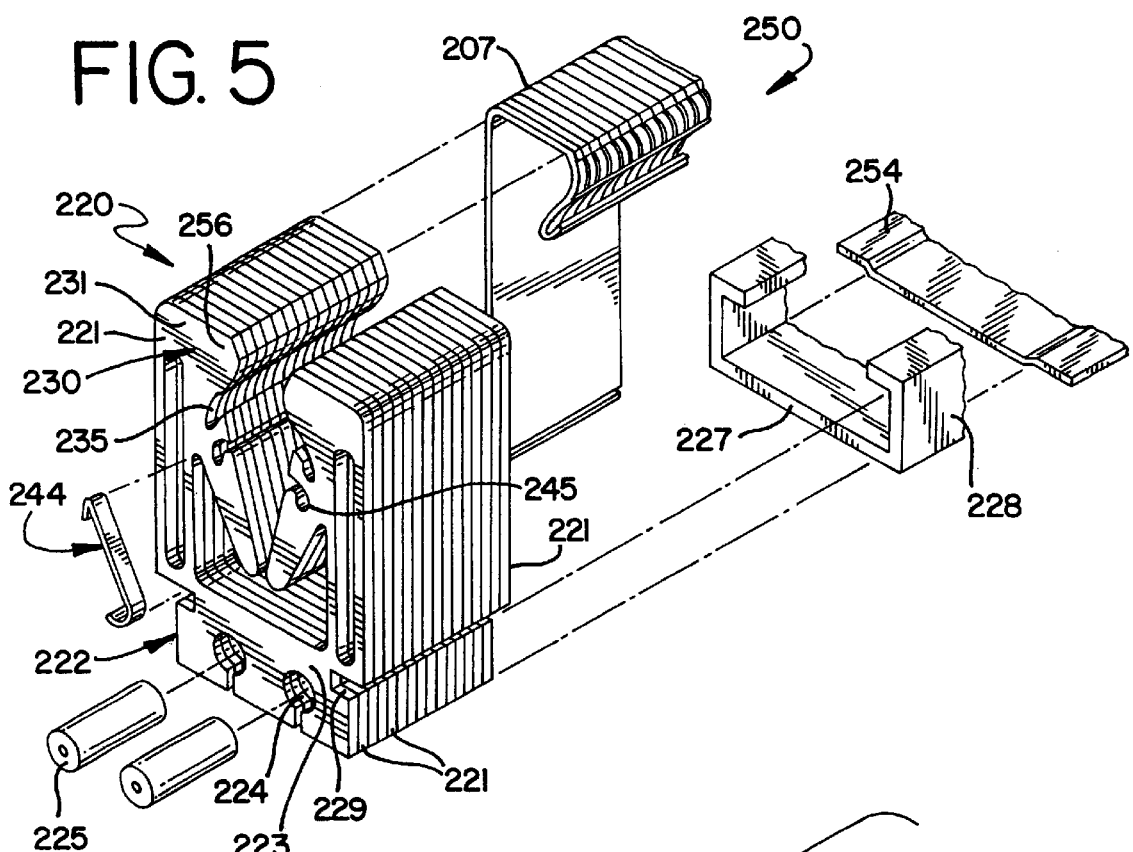
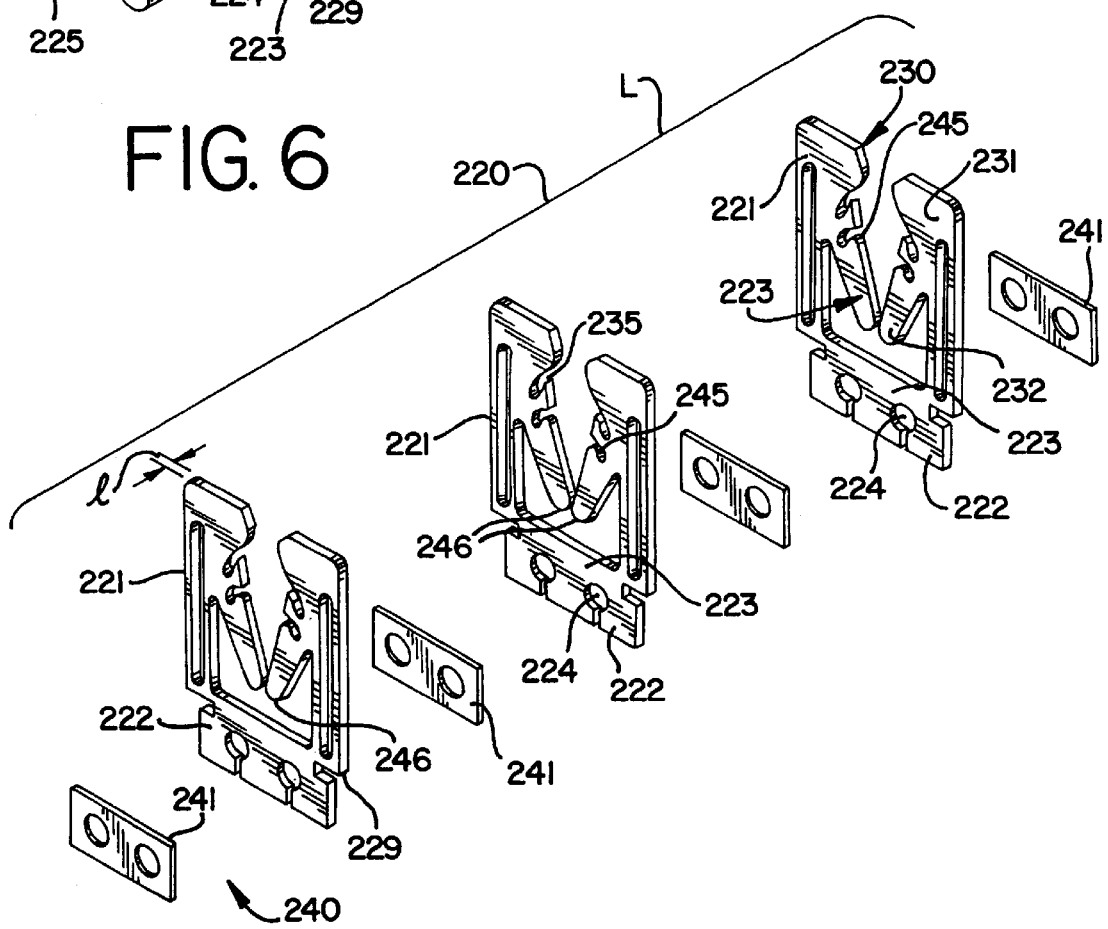

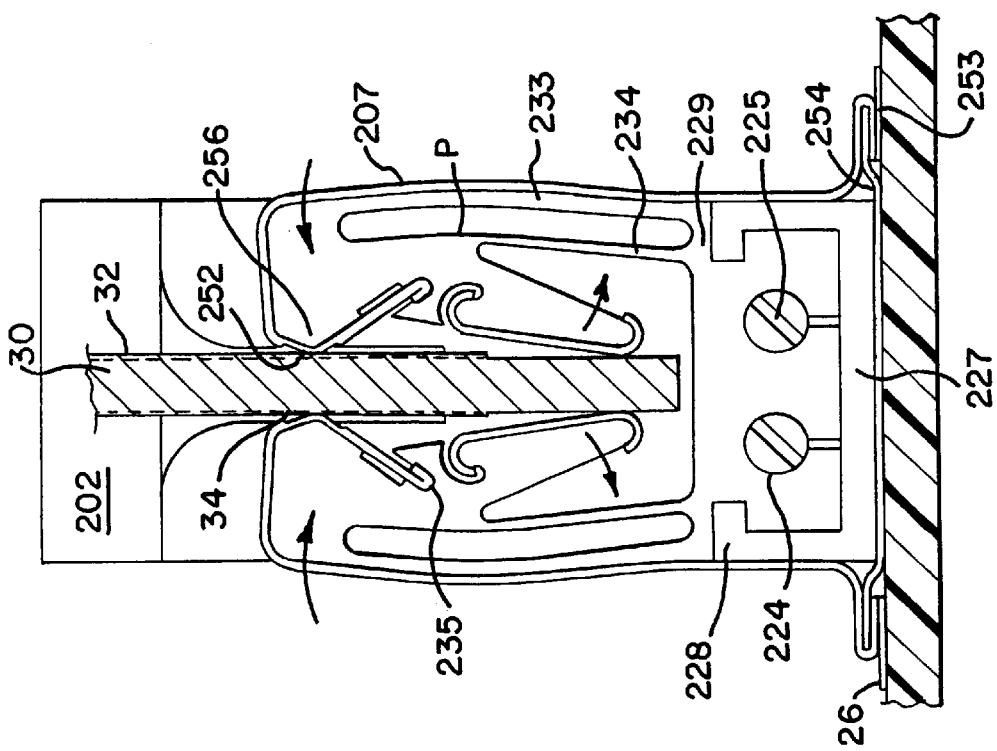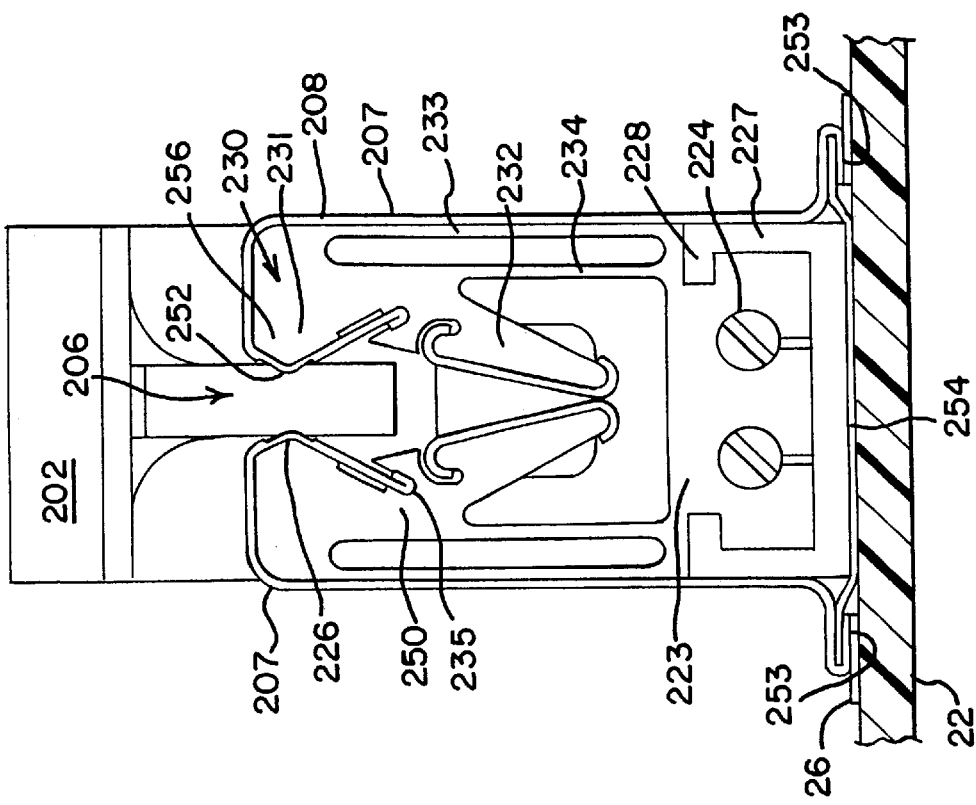

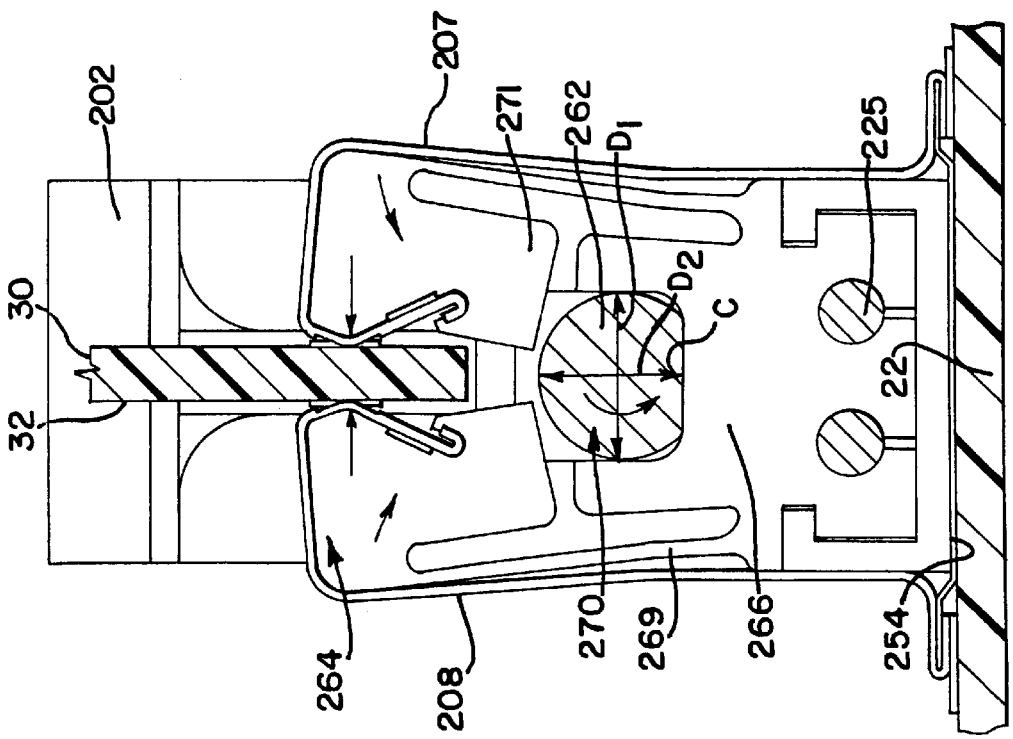
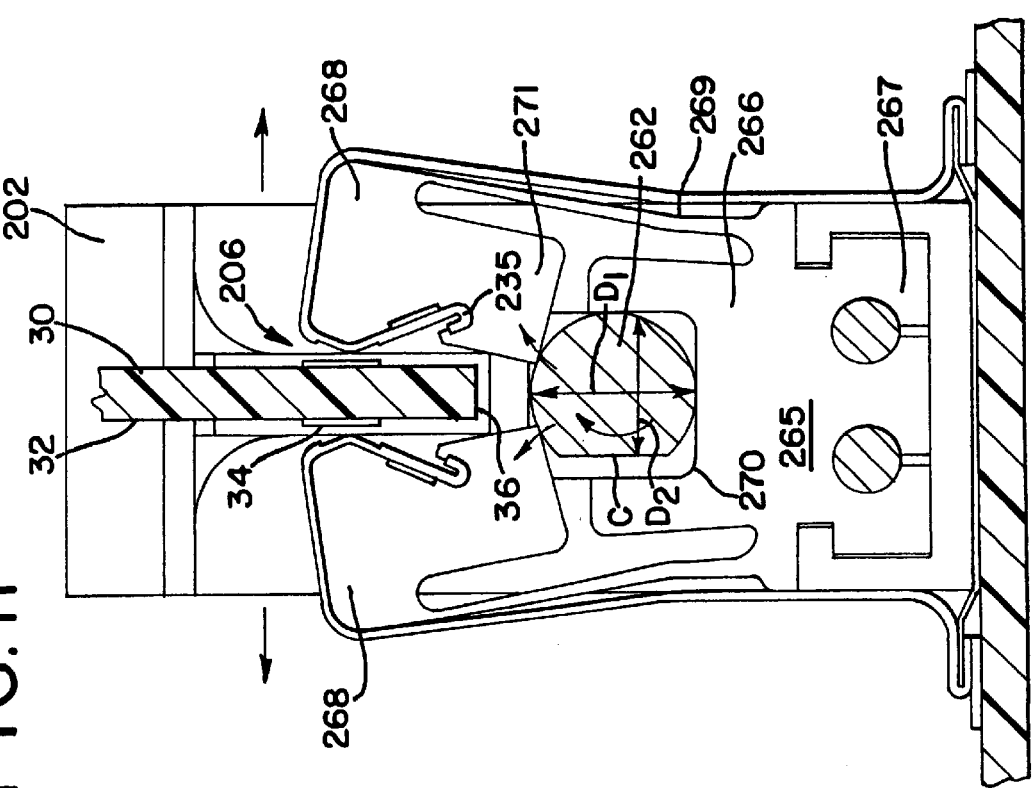

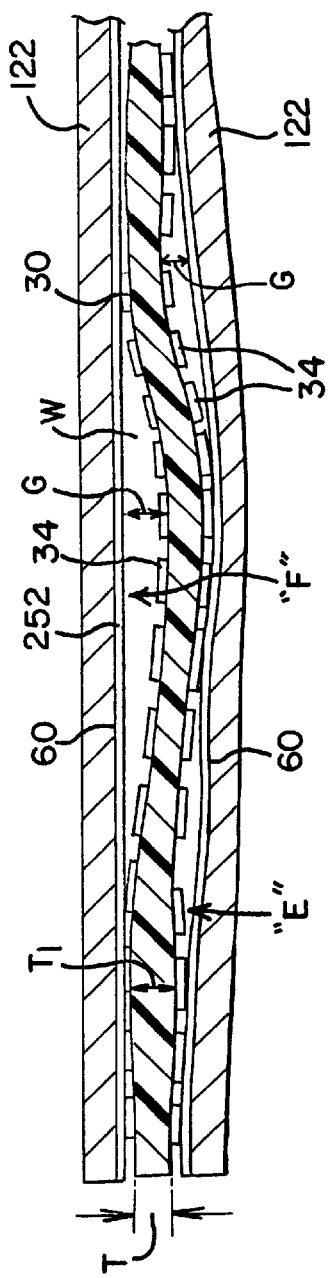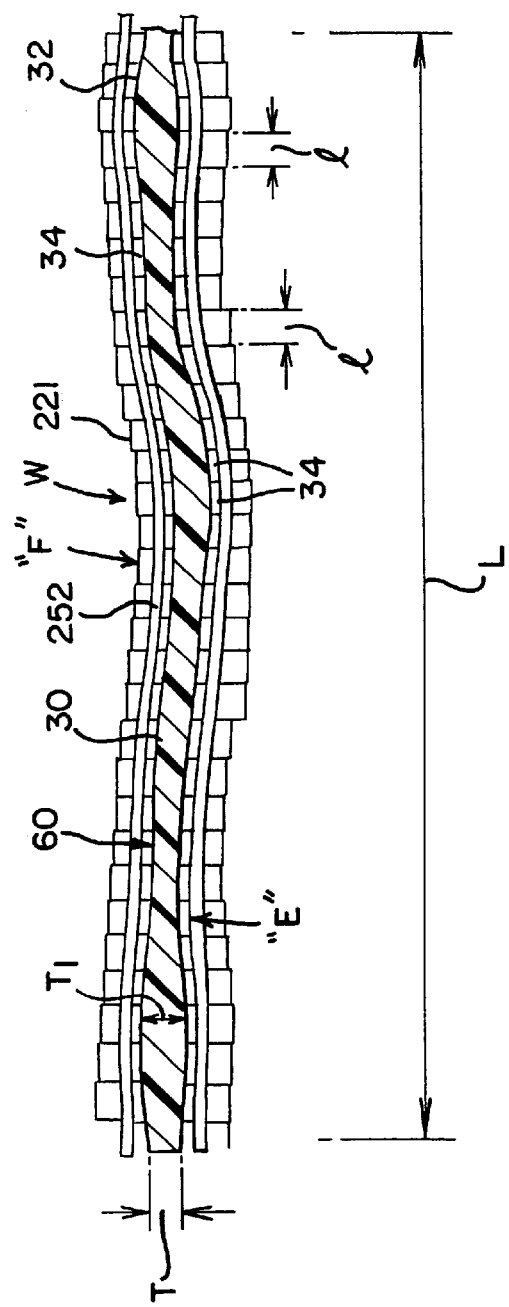

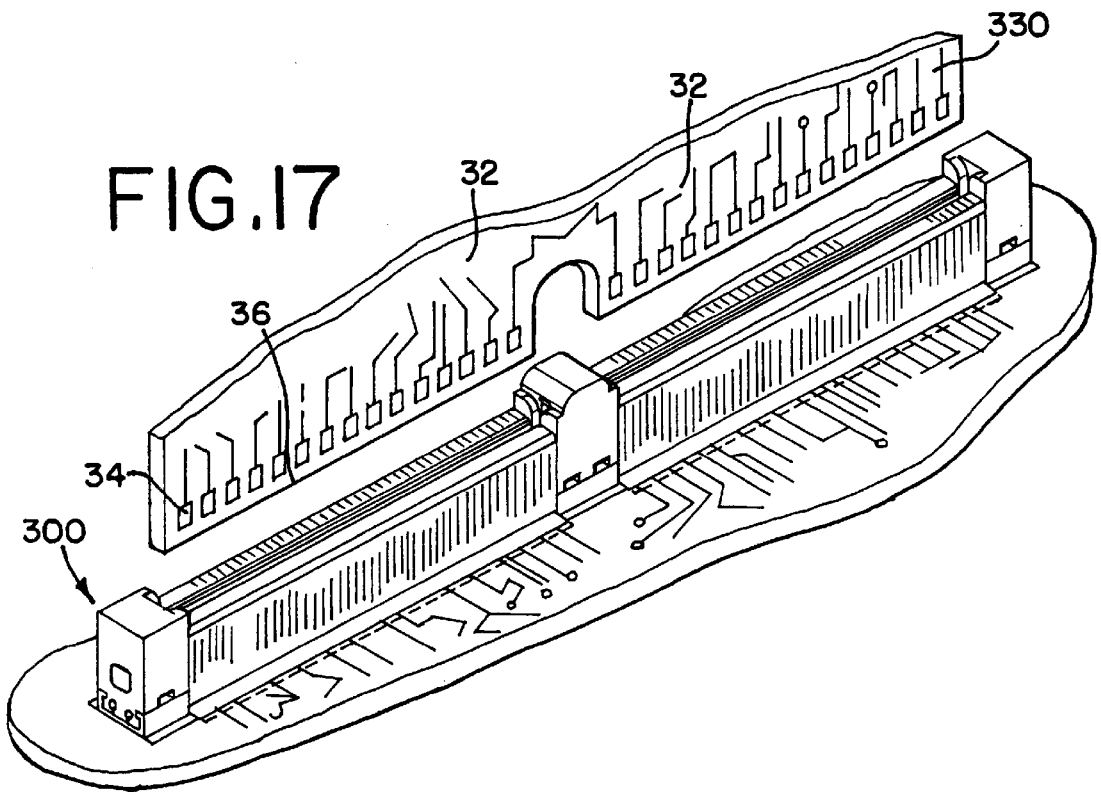
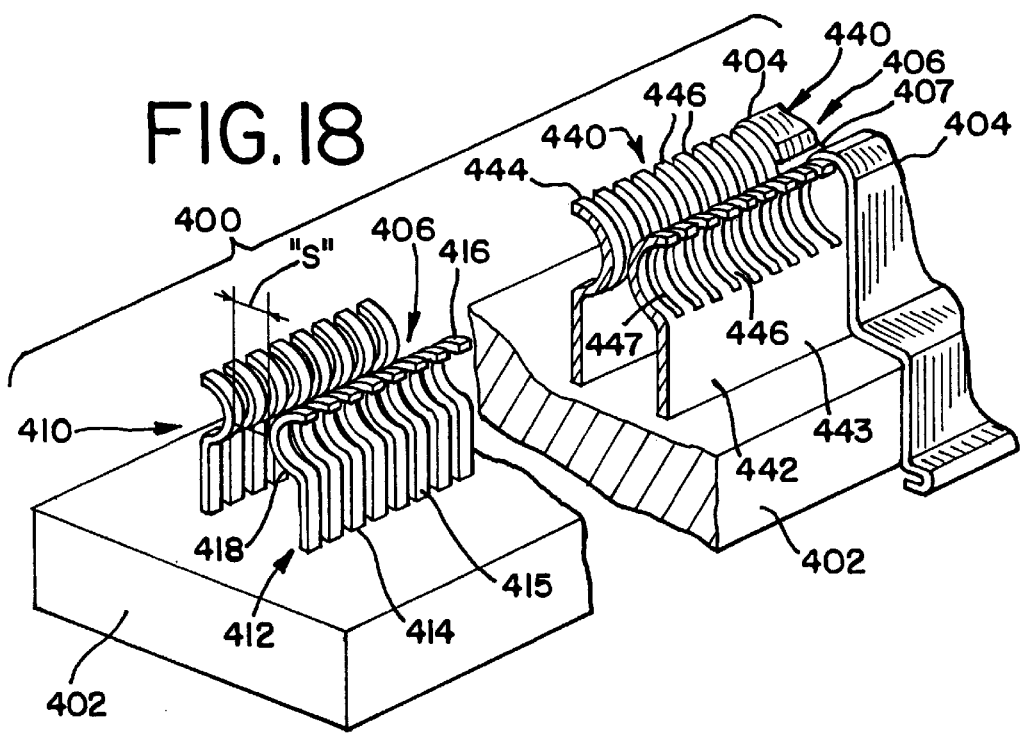

LAMINATED SPRING STRUCTURE AND FLEXIBLE CIRCUITRY CONNECTOR INCORPORATING SAME

BACKGROUND OF THE INVENTION

The present invention relates generally to edge card connectors, and more particularly to connectors that utilize flexible circuitry as the connector contacts and which have an improved card engagement means.

Connectors are well known in the art which provide a connection between a primary circuit board and a secondary circuit board and are commonly referred to in the art as edge card connectors. These connectors typically include an insulative housing having a slot extending lengthwise within the housing that receives an edge of the secondary circuit card and a plurality of contacts on opposing sides of the slot. The contacts of these connectors may be individual contacts that are stamped and formed, or they may be formed on a resilient continuous stratum, in the form of flexible film or flexible printed circuitry ("FFC"). With the use of FFC, very small pitches, i.e., the contact to contact spacing of about 0.3 mm may be obtained.

When FFC is incorporated in edge card connectors, such as those shown in U.S. Pat. No. 3,614,707 issued Oct. 19, 1971 and U.S. Pat. No. 5,427,533 issued Jan. 27, 1995, the FFC extends over the connector card-receiving slot so that a circuit card may be inserted into and withdrawn from the connector slot as needed. As described in U.S. Pat. No. 5,679,018 for "Circuit Card Connector Utilizing Flexible Film Circuitry" assigned to the assignee of the present invention, an edge card connector utilizing FFC has a circuit card-engaging means that utilizes elongated spring members that extend the length of the connector. These spring members are used to apply a contact force between the conductive traces of the FFC and the contact traces formed on the circuit card that oppose the FFC.

Although reliable, it has been discovered that this style of connector construction has some disadvantages, particularly in obtaining substantial compliance with the circuit card contact traces. Due to the fact that the particular spring members are continuous over the length of the connector, it is difficult for the spring members to exert a uniform contact force for the entire length of the circuit card when variations in the thickness of the circuit card occur. In order to counteract this compliance problem, a resilient layer such as is described in U.S. Pat. No. 5,505,625, issued Apr. 9, 1997 and assigned to the assignee of the present invention, may be applied to the spring members. This extra layer increases the complexity and cost of manufacture of such connectors.

Accordingly, a need for a FFC connector with increased compliance characteristics exists. Such a connector is not present or suggested by the prior art.

SUMMARY OF THE INVENTION

The present invention overcomes these disadvantages by providing a "laminated" style of spring structure in which the spring structure includes a plurality of discrete spring elements assembled lengthwise to form a spring structure that extends the length of the connector card-receiving slot. By utilizing separate spring elements, the aforementioned compliance problem is overcome because each spring element independently applies an individual contact force against the FFC toward the opposing contacts of a circuit card inserted into the connector.

In one principal aspect of the present invention and as exemplified by the preferred embodiment of the invention, a spring structure is provided that includes a plurality of individual spring members, or springlets, that extend lengthwise of the connector. These springlets cooperatively support extents of FFC for the length of the spring structure on opposite sides of a circuit card-receiving slot of the connector. Each of the springlets including a pair of spring arm portions that are spaced apart from each other to define an intervening slot for each springlet that forms part of the card-receiving slot of the connector. Each spring arm portion independently exerts a discrete contact force on a circuit card inserted into the connector card-receiving slot. The use of multiple, discrete springlets reduces loss of contact between the FFC and the circuit card contact traces when circuit card thickness variations occur.

In another principal aspect of the present invention, the springlets are formed with a particular configuration that together cooperatively provide a low-insertion force connector. In this instance, the two spring arm portions extend from a base portion of each springlet. Each spring arm portion includes distinct upper and lower lobes. The spring arm portions are interconnected to their respective springlet base portions by ways of two beams, one beam extending between the base portion and lower lobe, while the other beam extends between the base portion and upper lobe. The lower lobes of the spring arm portions are positioned on each springlet to project into the card slot at a level beneath the upper lobes. A card inserted into the card slot will thus engage the spring arm portion lower lobes and cause them to move outwardly with respect to the slot, thereby causing the spring arm portions to pivot and move the upper lobes thereof inwardly into contact with the contacts on the circuit card.

In still another principal aspect of the present invention and as exemplified by another embodiment, a zero-insertion force connector is provided wherein the connector includes an actuating mechanism that selectively moves the spring arm portions of the springlets into respective open and closed positions. In the embodiment described, movement of the actuating mechanism in one direction moves the spring arm portions outwardly into an open position for easy insertion of a card into the connector card slot, while movement of the actuating mechanism in another direction permits the spring arm portions to move inwardly into a closed position where the spring arm portions engage a circuit card inserted therein.

In yet another principal aspect of the present invention, the springlets are assembled together by one or more retainer members that extend through the springlet base portions. The base portions are assembled together with spacers in an interleaved fashion such that the spacers separate adjoining springlets. The retainer members hold the springlets together in a compressive fashion, while the spacers space the springlets apart from each other so that the retention force that holds the springlets together does not interfere with the card-engaging properties of the springlets. The spacers may take the form of separate elements of very minute thickness or may includes a plating applied to one or both opposing surfaces of the springlet base portions.

By forming a spring structure from a plurality of individual spring elements, each spring element applies a discrete, and independent contact force through the FFC and against the circuit card. Each contact force may be considered as an incremental force applied along an incremental extent of the card slot. In this manner, if variations are present in the thickness of the circuit card, these variations are compensated for within the extent of each incremental extent of the FFC that is supported by an individual spring element to thereby substantially reduce ineffective or no contact from occurring between the FFC and the circuit card contacts.

These and other objects, features and advantages of the present invention will be clearly understood through a consideration of the following detailed description.

BRIEF DESCRIPTION OF THE DRAWINGS

In the course of the following description of the detailed description, reference will be made to the attached drawings wherein like reference numerals identify like parts and wherein:

FIG. 1 is a perspective view of a prior art circuit card connector and circuit card that exemplifies the field of use and the type of connectors in which the present invention finds it greatest utility;

FIG. 2 is an exploded perspective view of the connector of FIG. 1;

FIG. 3 is an exploded perspective view of another prior art flexible film circuitry connector;

FIG. 4 is a perspective view of a circuit card connector with a laminated spring structure constructed in accordance with the principles of the present invention;

FIG. 5 is an exploded detail view of the spring structure and other associated components of the connector of FIG. 4;

FIG. 6 is a exploded view of a stack of spring elements used in the spring structure of FIG. 5;

FIG. 9 is a sectional view of the connector of FIG. 4 illustrating the spring elements of the spring structure at a rest position with no circuit card inserted into the connector card slot;

FIG. 10 is the same view as FIG. 9, but, illustrating a circuit card inserted into the connector card slot;

FIG. 11 is a sectional view of the connector of FIG. 8 illustrating the spring elements of the spring structure biased into an open position by the actuating member and without a circuit card inserted into the connector card slot;

FIG. 12 is the same view as FIG. 11, but illustrating a circuit card inserted into the connector card slot and the actuating member moved to a card-engagement position;

FIG. 13 is a diagrammatic view of a circuit card with thickness variations and a continuous spring member applying a contact force thereagainst;

FIG. 14 is a diagrammatic view of a circuit card with thickness variations and a laminated spring structure of the present invention applying contact forces thereagainst;

FIG. 17 is a perspective view of another embodiment of a double bay connector built in accordance with the principles of the present invention; and, FIG. 18 is a perspective view of another connector illustrating two alternate embodiments of a spring structure constructed in accordance with the principles of the present invention.

DETAILED DESCRIPTION OF THE PREFERRED EMBODIMENTS

Figure 7:
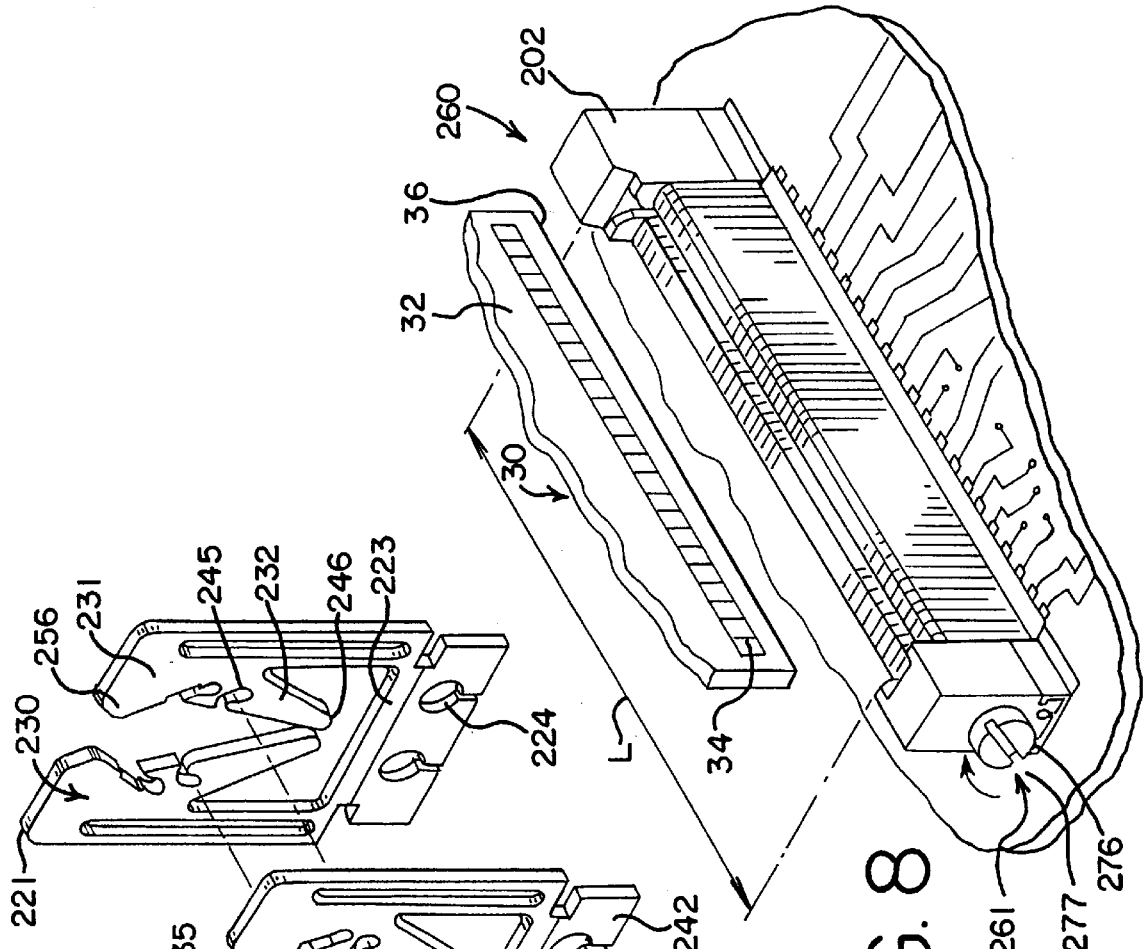
FIG. 7 is an exploded view of an alternate arrangement of spring elements for use in a spring structure such as that shown in FIG. 5.

FIG. 1 illustrates a prior art card connector, generally indicated at 20, constructed in accordance with the principles of the present invention. This connector and its constructions are described in U.S. Pat. No. 5,679,018 for "Circuit Card Connector Utilizing Flexible Film Circuitry" and which is assigned to the assignee of the present invention.

The connector 20 illustrates the type and style of circuit card connectors to which the present invention is directed. The connector 20 is mounted to a primary printed circuit board 22 having a plurality of different circuits 24 disposed thereon leading to a plurality of associated contact pads, or traces 26, located on a mounting surface 28 of the circuit board 22.

The connector 20 is intended to provide a connection between the circuit board 22 and a secondary circuit card 30 having a substrate 32 and a plurality of contact pads 34 aligned with an insertion edge 36 of the circuit card 30. The circuit card 30 has its contact pads 34 disposed on both sides thereof, typically arranged in an array of one or more distinct rows 35 proximate to the insertion edge 36. These contact pads 34 may, if desired, be electrically connected in ways well known in the art to provide redundant contact surfaces in order to enhance the reliability of the circuit card-connector connection.

Turning now to FIG. 2, it can be seen that the connector 20 has a housing, or body 38, that extends lengthwise and which generally includes two opposing end portions 40, preferably which are formed from an electrically insulative material, such as a plastic. These end portions 40 serve to define the overall length of the connector 20 and its housing as well as the longitudinal extent of a circuit card-receiving slot 80 of the connector 20. In this regard, the end portions 40, each include a recess 42 formed therein, which extends down from the upper surfaces 43 thereof to a predetermined depth. (FIG. 2.)

These recesses 42 communicate with the interior, opposing faces 45 of the end portions 40 and may include in proximity to the upper surfaces 43 thereof, ramped portions 46, that provide lead-in surfaces into the recesses 42 to facilitate entry of the circuit card 30 into the connector card-receiving slot 80. Although the housing shown is defined by the two spaced-apart end portions 40 and the connector base 54 as illustrated in FIG. 4, it will be understood that the term "connector housing" as used herein is to be given its broadest interpretation and, as such, is intended to include connector structures that may have longitudinal sidewalls which extend the entire length of the connector 20.

The lower surfaces 47 of the end portions 40 are adapted to sit on the circuit board surface 28 and may be provided, as illustrated in FIG. 2, with mounting lugs or posts 49. The connector end portions 40 are preferably aligned lengthwise along a longitudinal axis of the connector 20 so that their respective recesses 42 confront each other and preferably so that they are maintained in registration with respect to a centerline of the card-receiving slot 80 of the connector 20.

The connector end portions 40 not only define opposing ends of the connector circuit card-receiving slot 80 by way of their respective recesses 42, but they also support a circuit card-engagement assembly 50 therebetween. The components which make up this circuit card-engagement assembly 50 are best illustrated in FIG. 2. The connector circuit card-engagement assembly 50 includes an extent of flexible film or flexible printed circuitry (collectively, "FFC") 60, that has a plurality of conductive traces, or contacts 66, formed thereon. These traces, as known in the art, are arranged in side-by-side order on flexible circuitry 60 and have first conductive portions 62 exposed in areas flanking the card-receiving slot 80 and second conductive portions 63 exposed at opposite ends thereof that oppose the mounting surface 28 of the circuit board 22. Such flexible circuitry 60 typically has a laminated construction utilizing flexible electrical contacts, or traces 66, formed from conductive metal foils and bonded to a flexible, electrically insulative base layer such as a polyamide film. An outer insulative layer 65 may be utilized that overlies the contacts 66.

The connector end portions 40 may also include hollow cavities 52 formed in their lower surfaces that receive opposing end tabs 53 of a connector base member 54. The connector base member 54 extends lengthwise between the connector end portions 40 and preferably has a width slightly greater than the end portions 40 in order to provide support for the flexible circuitry 60 of the connector 20, especially at the area of the second conductive portions 63. The end portion 40 further has a flat central portion 55 (FIG. 2) which may be considered as defining the lowermost extent of the card-receiving slot 80.

In order to support the flexible circuit members 60, the connector end portions 40 may include openings 70 that support a pair of rails 71 therein. These rails 71 in turn support a pair of elongated spring members 72 that extend for the length of the card slot 80. These spring members 72 have upper arms 73 and lower legs 74. The flexible circuitry 60, especially the first conductive portions 62 thereof, are supported on the upper arms 73 while the lower spring legs 74 extend into the card slot 80. Insertion of the circuit card 30 into the card slot 80 of the connector 20 impinges upon the spring member lower legs 74 and causes the spring member upper arms 73 and the first conductive portions 62 of the FFC supported thereon to pivot and thereby move into contact with the edge card contacts 34.

FIG. 3 illustrates another connector 100 described in the aforesaid U.S. Pat. No. 5,679,018. This connector 100 has two end portions 102 that connect with a base member 104 to cooperatively define a housing, or body, of the connector 100. A plurality of posts 106 extend upwardly from the base member 104 and are spaced apart from each other both lengthwise and laterally within the connector 100 on opposite sides of a central portion 108 of the base member 104 to provide a preload, or biasing, force to an elongated cradle spring 110. These posts 106 hold the cradle spring 110 in position to maintain a predetermined separation between the free ends of the cradle spring 110 regardless of the tolerances to which the cradle spring 110 may be made.

The cradle spring 110 is continuous in its length and extends lengthwise between the connector end portions 102 and includes a plurality of transverse slots 112 which are spaced apart from each other in the longitudinal direction. These slots 112 are dimensioned to receive the base member posts 106. As seen in FIG. 3, the cradle spring 110 has a base 114 and two sidewalls 116 that extend upwardly therefrom to terminate in free ends 118. The free ends 118 lie on opposite sides of a centerline of the connector 100 and of the card-receiving slot 120. These free ends 118 include a series of engagement lugs 121 spaced apart thereon that serve to retain the spring members 122 in place along the cradle spring 110. These lugs 121 extend laterally inwardly from the cradle spring sidewalls 116 so that they engage the spring members 122.

The posts 106 of the connector base member 104 have a configuration that applies a predetermined and outwardly-directed biasing force against the cradle spring 110. The spring members 122 extend lengthwise along the cradle spring 110 and have spaced-apart openings 124 that extend lengthwise along the cradle spring 110 in the same spacing as the cradle spring engagement lugs 121 so that when assembled, the spring members 122 rest on the cradle spring 110 and the engagement lugs 121 extend through the spring member openings 124. These spring members 122 also have a general S-type shape with distinct upper spring arms 125 and lower spring legs 126 that extend lengthwise along the connector 100 at different levels within the card-receiving slot 120.

These spring members 122 support the flexible circuitry 60 which is applied to the outer surfaces of the upper spring arms 125. The flexible circuitry 60 extends down toward the connector base member 104 where the second conductive portions 63 thereof are aligned with and soldered to the contact traces 26 on the circuit board mounting surface 28. A pair of retention clips 128 may be received within outer slots 129 of the connector end portions 102 and may include arms 130 that extend longitudinally therefrom and engage the spring members 122.

It has been discovered, that in using the prior art connectors 20 & 100 that during insertion and withdrawal of the circuit card 30 into the connector that variation in the thickness T of the circuit card 30 may detrimentally affect the engagement by way of gaps G that may occur between the circuit card contacts 34 and the FFC first conductive portions 62. This detrimental contact occurs as a matter of compliance between the connector spring members of the two aforementioned connectors. The spring members in these connectors and in other prior art connectors are elongated spring members that extend for the entire length of the connector card slot. Because these spring members are continuous along their entire length, the spring members are not able to compensate for variations in the thickness T of the circuit card 30.

This problem is illustrated diagrammatically in FIG. 13, wherein it can be seen that the thickness T of the circuit card 30 varies along its length, with one portion having a thickness $T_1$ that is greater than the nominal thickness T. Additionally, the circuit card 30 may have a slight amount of warpage W so that it is not completely planar on the opposing surfaces thereof upon which the card's contact pads 34 are situated. When continuous, one-piece spring members 122 are used in a connector to support FFC 60 and to grip the circuit card 30, the contact force exerted by the spring members 122 upon the circuit card 30 may not be uniform along the length of the circuit card. The abnormal thickness $T_1$ and warpage W may result in very light or no contact from occurring between the spring members 122, the FFC 60 supported thereby and the circuit card contacts 34. It can be seen from FIG. 13, that in the area E adjoining the thickness variation $T_1$ and in the area F of the warpage W, the spring members 122 and FFC 60 lie slightly away from the circuit card contacts 34.

Some attempts in the prior art have been made to address this compliance issue and have utilized a soft or elastomeric layer to the spring members 72, 122 underneath the area of the FFC first conductive portions 62. This solution requires an additional manufacturing and application step which increases the complexity of manufacturing and may affect the ultimate cost of the connector by increasing it. Problems with this solution may arise with applying a uniform layer of the elastomeric material and the compliance characteristics of the layer must be calculated.

The present invention provides a solution to this problem without the use of an additional compliant layer and rather sets forth a novel solution to the spring structure of the connector. The present invention utilizes a multiple element, or "laminated" spring structure, that relies upon the incremental spring action of many multiple, independent spring elements, or "springlets", against the circuit card. The springlets are held together for along a predetermined length to define a segmented spring structure that flanks the card slot.

Turning now to FIG. 4, a connector constructed in accordance with the principles of the present invention is illustrated at 200. The connector 200 is adapted to be mounted to a circuit board 22 alignment with a plurality of contact traces, or pads 26 arranged on a mounting surface 28 thereof that lead to a plurality of circuits 24.

The connector 200 provides an electrical connection between the circuit board 22 and a circuit card 30 having a similar plurality of electrical contacts 34 that are preferably arranged along an insertion edge 36 of the circuit card 30. The connector 200 has two end portions 202 that define the overall length of the connector 200. One end portion 202a may be configured to include a locating feature that serves to assist in guiding the circuit card 30 into the connector 200. Flexible film circuitry 204 extends between the connector end portions 202 and is arranged on opposite sides of a circuit card-receiving slot 206 of the connector 200. In the embodiments illustrated, the flexible circuitry 204 has a length L that is equal to the length of the card-receiving slot 206 and includes two separate extents 207, 208 of flexible circuitry that are supported on opposite sides of the card-receiving slot 206.

As illustrated best in FIGS. 5 & 9–12, the flexible circuitry 204 is supported on a novel and unique spring structure 220. As shown in FIG. 5, the spring structure 220 takes the form of a laminated or segmented spring comprised of many, substantially identical spring elements, or "springlets" 221. Each springlet 221 may be considered as having a body portion 223, a base portion 222 and two spring arm portions 230. The base portions 222 may include one or more openings 224 formed therein that receive a suitable retention means, such as rivets 225 that are provided to retain the springlets 221 together along a predetermined length L of the connector 200. The rivets 225 preferably apply a compressive force to the springlets 221 at their base portions 222. These rivets 225 preferably extend lengthwise through the spring structure 220 and may also extend through the connector end portions 202 and interconnect the springlets 221 to the end portions 202 to form the connector 200. Alternate means other than the rivets 225 illustrated of connecting the spring structure 200 to each other or to the connector end portions 202 are also contemplated.

The springlets 221 are preferably substantially identical to each other and have a common thickness. They are preferably made from a resilient, spring-like material such as metal or plastic. As mentioned above, each springlet 221 includes a pair of spring arm portions 230 that extend above body portions 223 and base portions 222 thereof. The springlets 221 may be produced by a suitable manufacturing process, such as stamping, that can provide the springlets 221 within appropriate dimensional tolerances. As explained in greater detail below, the structure of the spring arms 230 may be tailored to provide the connector 200 with either low-insertion or zero-insertion force characteristics.

In order to provide a low-insertion force aspect to the connector 200, the spring arm portions 230, as shown best in FIGS. 5,6,9, & 10 may include upper and lower spring lobes 231, 232. These two spring lobes 231, 232 are connected together and are also connected to the springlet base portions 222 by respective first and second beam members 233, 234. The first beam members 233 have relatively longer transverse thicknesses than the second beam members 234 that provide an inward bias to the spring arm portions 230 to maintain the "rest" position as illustrated in FIG. 9.

The spring arm portions 230 support the two respective extents of flexible circuitry 207, 208 on opposite sides of the card slot 206 of the connector 200. One edge 250 of the flexible circuitry 207, 208 is preferably folded upon itself as illustrated in FIGS. 5 & 9 and is held within a retention slot 235 formed in the upper lobes 231 of the springlets 221. The retention slots 235 locates the first conductive portions 252 of the flexible circuitry 207, 208 in alignment with card-contacting surfaces 256 of the spring arm portion upper lobes 231. The flexible circuitry extends downwardly along the exterior surfaces of the first (and outer) beams 233 and are preferably be folded upon themselves at their opposite ends proximate to the second conductive portions 253 thereof.

An elongated base plate 254 may be provided that extends between the connector end portions 202 and underneath the flexible circuitry 207, 208 to add a measure of rigidity to the circuitry 207, 208 and thereby facilitate the attachment, such as by soldering, of the second conductive portions 253 to the opposing circuit board contact pads 26.

In order to control lateral alignment of the springlets 221, an elongated retainer base 227 may be provided in the form of a channel having one or more retention arms 228 formed on flanges of the channel 227. These retention arms 228 are received within corresponding slots 229 formed in opposing sides of the springlets 221. In operation, the base portions 222 of the springlets 221 are partially supported within the channel 227 on the web thereof that interconnects the two flanges together. To provide a measure of vertical support and to facilitate engagement with the springlets 221, the springlet base portions 222 may be made narrower than the upper part of the springlets 221 as illustrated in FIGS. 9–12. The channel 227 may be affixed to the connector end portions 202 by a suitable means, such as by crimping.

As can be seen best in FIG. 9, the lower lobes 232 of the spring arm portions 230 extend into the card-receiving slot 206 for a greater distance than that of the upper lobes 231 of the spring arm portions 230, when the connector 200 is empty and in order to enhance the low-insertion force aspect of the connector 200. When a circuit card 30 is inserted into the connector card slot 206 as illustrated in FIG. 10, the insertion edge 30 of the circuit card 30 impinges upon the lower spring lobes 232 and urges them outwardly toward the twin connecting beams 234 in the manner illustrated by the lower arrows of FIG. 10. This causes the upper spring lobes 231 to move inwardly toward the card slot 206 and the spring arm portions 230 to pivot or move about a point P. Continued insertion of the circuit card 30 to the position shown in FIG. 10 urges the spring arm portion upper lobes 231 (and the first conductive portions 226 supported thereon) into engagement with the contact pads 34 of the circuit card 30 so that they apply a normal force against the circuit card 30.

FIG. 14 diagrammatically illustrates the beneficial aspects of utilizing multiple spring elements 221 of the present invention rather than continuous spring members as taught by the prior art. It will be appreciated that each spring element 221 has a discrete predetermined length 1 that is approximately equal to the width of the contacts of the first conductive portions 252 of the flexible circuitry 60. Because discrete spring elements 221 are used, each such discrete spring element applies a discrete, individual contact force against the first conductive portions 252 of the flexible circuitry and against the contact pads 34 of the circuit card 30 within the length L of the spring element 221. The discrete lengths of the spring elements 221 are small enough so that gaps G will not occur. In this manner, thickness variations T and warpage W of the circuit card 30 will not result in the formation of detrimental gaps G occurring between the circuit card 30 and the flexible circuitry 60. Thus, a continuous contact force is applied to the circuit card as a continuous by the individual spring elements 221 along the length of the connector card-receiving slot 206.

The compressive force applied by the rivets 225 to the base portions 222 of the springlets 221 may, in certain circumstances, apply a like compressive force to the spring arm portions 230. In order to reduce the likelihood of the compressive force applied to the springlet base portions 222 from affecting the individual circuit card-engaging ability of the spring arm portions 230 thereof, means 240 for spacing the springlets 221 apart may be provided and interleaved between the adjoining springlets 221. One such means is illustrated in FIG. 6 as separate spacer elements 241. The spacer elements 231 are thin, in the order of approximately 1 mil. (0.001 inches) and may be formed from a non-conductive material as shown in FIG. 6 in instances where the springlets 221 are formed from a conductive material, such as a metal. Alternatively, as shown in FIG. 7, the spacer elements 241 may be formed directly as a layer 242 on and as part of the springlet base portions 222, such as by plating or any other suitable material deposition technique. The spacer elements 241 and spacer layers 242 will serve to slightly space apart the spring arm portions 230 of adjacent springlets (when viewed from the side) 221 along the length of the spring assembly 220.

In order to prevent abrasion of the circuit card insertion edge 36, the springlets 221 may also include one or more C-shaped edge clips 244 that are applied to the springlet body portions 223 at the lower spring lobes 232. These edge clips engage a slot 245 and the bottoms 246 of the lobes 232 and will prevent the lower lobes 232 from acting in saw tooth fashion against the insertion edge 36 of the circuit card 30 when inserted. The edge clips 244 may be in the form of individual clips applied to each springlet 221 or they may constitute a single elongated clip having a length L that extends the length of the spring assembly 220.

Figure 8:
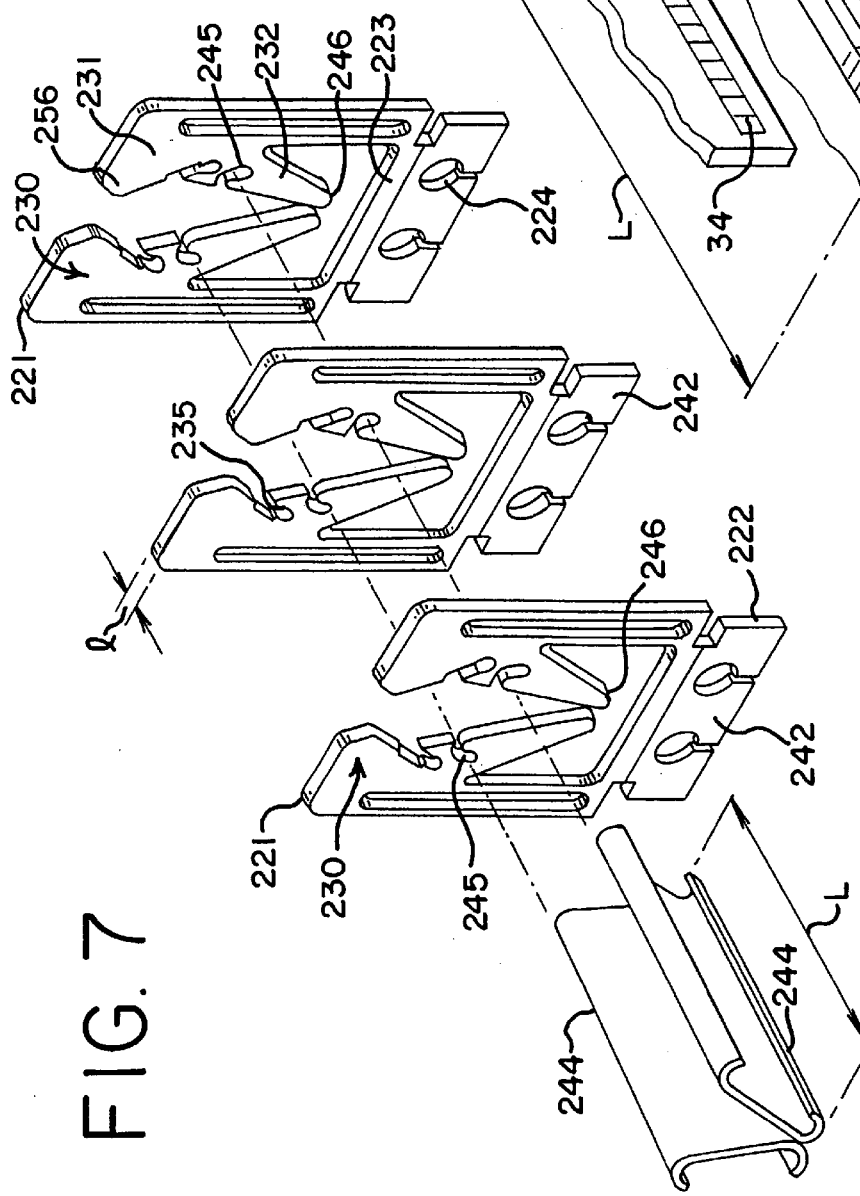
FIG. 8 is a perspective view of an alternate embodiment of a connector constructed in accordance with the principles of the present invention, with zero-insertion force characteristics.

FIG. 8 illustrates another embodiment of a connector 260 constructed in accordance with the principles of the present invention. The connector 260 is one that has a modified spring element configuration to provide zero-insertion force characteristics to the connector. The connector 260 utilizes an actuating member 261 in the form of an elongated rod 262 that extends the length L of the card-receiving slot 206 and is received within the connector end portions 202.

Figure 15:
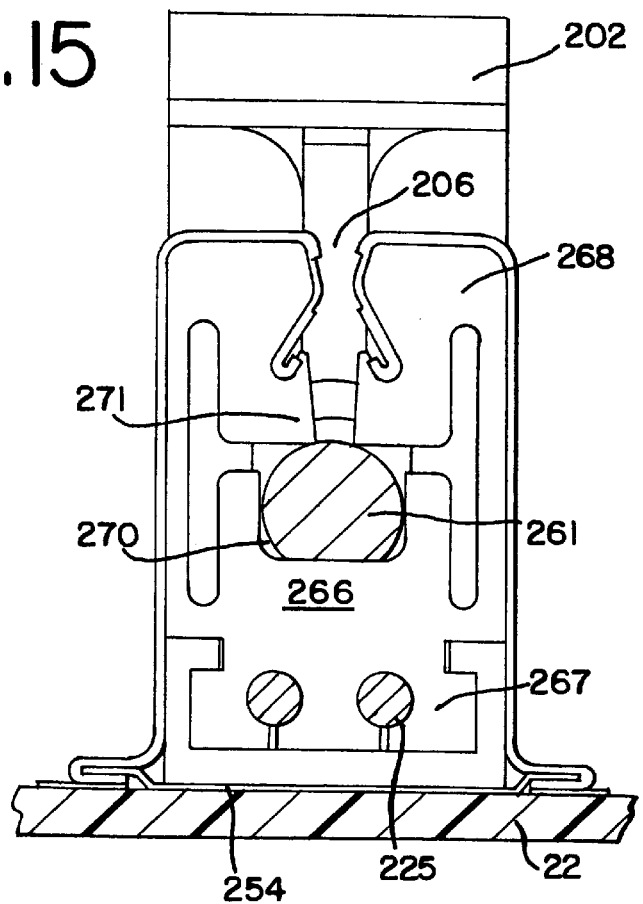
FIG. 15 is the same view as FIG. 12, but with the circuit card removed from the card-receiving slot.

As best seen in FIGS. 11, 12 & 15, the connector 260 utilizes a spring assembly 264 with individual spring elements 265. Each such spring element 265 is of a predetermined discrete length 1 and has a body portion 266, a base portion 267 and a pair of opposing spring arm portions 268 that extend above the body portions 266 and are connected thereto by way of vertical beam members 269.

As illustrated in FIG. 15, which depicts a cross-section of the connector 260 at a rest position with no circuit card 30 present in the card-receiving slot 206, the opposing spring arm portions 268 partially extend into the card-receiving slot 206. They are typically separated by a distance that is less than the thickness of the circuit card 30. Preferably, in this position the lower lobes 271 of the spring arm portions 268 rest upon the actuating member 261 in a manner such that they are moved, or "cammed", outwardly upon one rotation of the actuating member 261 and released from their cammed position upon a counterrotation of the actuating member 261.

This camming action provides the connector 260 with a zero-insertion force. FIG. 11 illustrates the actuating member 261 rotated into a first operative position where the spring arm portions 268 are spread outwardly to permit easy insertion of the circuit card 30 into the card-receiving slot 206. The actuating member 261 illustrated takes the form of a cylindrical rod 262 or with a portion thereof truncated along a chord C of the cylinder. This truncation forms respective major and minor axes or diameters $D_1$, $D_2$ of the actuating member 261 where the major diameter $D_1$ is greater than the minor diameter $D_2$. Although a truncated cylindrical rod 262 is illustrated, it will be understood that other similar eccentric configurations, such as elliptical actuators, will be just as effective in operation.

The body portions 266 of the spring elements 265 are provided with a central passage 270 that is continuous through the length of the spring assembly 264. This passage 270 receives the actuating member 261 thereon and cooperatively operates with the actuating member 261 and the spring arm portions 268 to effect the opening and closing described herein within the passage 270. In this orientation, the lower spring arm lobes 271 ride upon the outer surface of the actuator rod 262. The length of the major diameter $D_1$ is enough to force, by way of the lower lobes 271, the spring arm portions 268 outwardly with respect to the card-receiving slot 206. This permits the insertion of a circuit card 30 into the slot 206.

When the card 30 is fully inserted in the slot 206, the user rotates the actuating member 261 into its second operative position as depicted in FIG. 12 so that its minor diameter $D_2$ is now vertical. With $D_2$ being shorter than $D_1$, the spring arm portions 268 then are released from their outward bias and they spring back towards the card-receiving slot 206 under the influence of the beam 269 so that the first conductive portions 252 of the flexible circuitry 207, 208 are brought into contact with the circuit board contacts 34. The actuating member 261 may be supported within the connector end portions 202 by bearings, retaining rings or other suitable means.

The actuating member 261 may be provided with means for manual manipulation thereof, such as a slot 277 formed in an endcap 276 of the actuating rod 262 into which a screwdriver or other tool may be inserted to rotate the actuating rod 262 between its two operative positions. Other structural features, such as levers, may be used to manipulate the actuating rod between its different operative positions.

Figure 16:
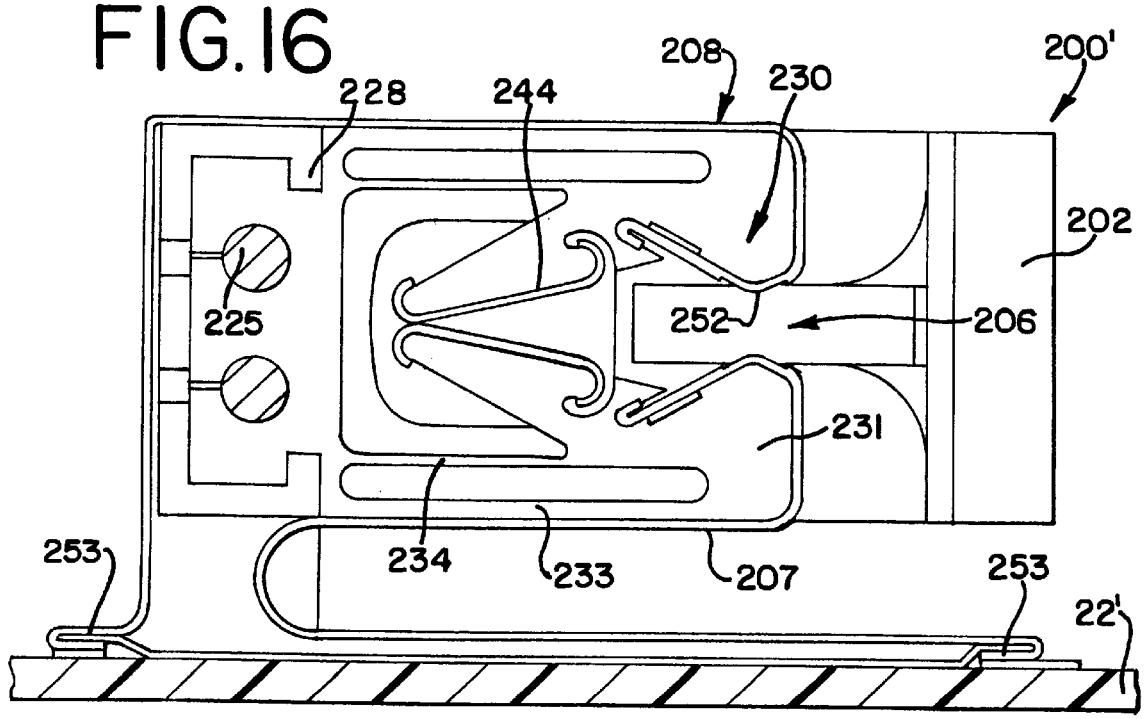
FIG. 16 is another embodiment of the present invention illustrating the use of the spring structure in a connector with a right angle orientation.

Although the foregoing description has been in terms of the connectors of the present invention as being mounted vertically to the circuit board, the spring structure of the present invention may be used in other orientations such as a right angle connector 200' as illustrated in FIG. 16 in which the orientation of the card-receiving slot 206 of the connector 200' is parallel to the circuit board 22 rather than perpendicular. Additionally, as illustrated in FIG. 17, connectors 300 in accordance with the present invention may include dual circuit card-receiving bays 301 in order to accommodate either additional circuit cards or circuit cards 330 of greater length than the circuit card 30 shown in FIGS.

4 and 8. The latter instance serves to increase the overall length of the connector 300.

FIG. 18 illustrates another embodiment of a connector 400 and depicting the use of two alternate spring structures 410 and 440. Both spring structures 410, 440 are supported on an elongated base member and the spring structures 410, 440 serve to support extents of flexible circuitry 404 on both sides of a circuit card-receiving slot 406.

In the spring structure 410 shown in the left of FIG. 18, a plurality of individual, discrete spring elements 412 are supported in the base member 402, preferably within corresponding openings 414 so that the spring elements 412 may be inserted by conventional means, such as by stitching them into the openings 414. Each spring element 412 has a base portion 415 and a free end portion 416 that extend upward from the base member 402 in a cantilevered fashion. The free end portions 416 include spring arm portions 418 that extend inwardly of the card-receiving slot 406. These spring arm portions 418 support the flexible circuitry 404 and particularly, the first conductive portions 407 thereof within and on opposite sides of the card-receiving slot 406. Preferably, the spacing S is less than the normal thickness of the circuit card inserted into the connector 400 so that the spring arm portions 418 will have an inherent bias into contact with the circuit card, when inserted into the card-receiving slot 406.

The right side of FIG. 18 depicts another fashion of a spring structure 440 that utilizes two elongated spring members 442 supported on the base member 402. These spring members 442 have respective opposing base portions 443 and free end portions 444. The free end portions 444 of the spring members 442 are preferably stamped to define a plurality of individual spring elements 446 that are separated from each other by intervening spaces 447 so that, in effect, the spring elements 446 are cantilevered up from the base portions 443. This separation and the length of the spaces 447 permits each spring element to act discretely within its length and apply a discrete normal force against the flexible circuitry 404 and a circuit card inserted into the card-receiving slot 406 akin to the manner of the previous embodiments.

Accordingly, it will be appreciated that the embodiment of the present invention which has been discussed herein is merely illustrative of a few applications of the principles of the invention. Numerous modifications may be made by those skilled in the art without departing from the true spirit and scope of the invention.

I claim:

1. An electrical connector for effecting a connection between a plurality of first circuits disposed on a mounting surface of a circuit board and a plurality of second circuits on a circuit card, the circuit card having two circuit faces disposed on opposite sides of said circuit card, at least one of said circuit card faces including a plurality of individual contact areas arranged in a predetermined pattern, the contact areas forming portions of said circuit card second circuits, the connector having improved card-engagement characteristics, said connector comprising:

two opposing connector end portions, a spring assembly extending lengthwise between the connector end portions, the spring assembly having a slot for receiving the circuit card therein, a plurality of electrically conductive contacts disposed on opposite sides of the card-receiving slot and supported by said spring assembly, the contacts having first conductive portions disposed thereon and extending within said card-receiving slot and second conductive portions extending proximate to said circuit board first circuits when said connector is installed upon said circuit board, said spring assembly including a plurality of discrete, resilient springlets arranged in side-by-side order and extending along a length of said spring assembly, each of the springlets having a discrete length and further including a base portion and two spring arm portions, the spring arm portions extending from said springlet base portion and being spaced apart from each other to cooperatively define a portion of said card-receiving slot therebetween, said spring arm portions each supporting respective first conductive portions on opposite sides of said card-receiving slot, said spring arm portions including pairs of respective upper and lower spring arm lobes, said upper and lower spring arm lobes confronting each other on opposite sides of said card-receiving slot, each of said springlets further independently exerting a biasing force on said respective first conductive portions to thereby urge said first conductive portions of said contacts toward said card-receiving slot and into contact with said circuit card contact areas when said circuit card is inserted into said card slot.

2. The connector as defined in claim 1, wherein said springlets are held together lengthwise along said spring assembly by at least one retainer applying a retention force to said springlet base portions.

3. The connector as defined in claim 2, wherein said retainer includes a post and said springlet base portions include at least one opening formed therein that receives said post.

4. The connector as defined in claim 1, wherein each of said springlets includes a central passage extending therethrough and communicating with said spring arm portions and said connector further includes an actuator extending lengthwise through said connector by way of said springlet central passages, the actuator being operable between a first and a second operative position, wherein when said actuator occupies said first operative position, said actuator exerts an opening force on said two spring arm portions of said springlets to thereby spread them and said first conductive portions supported thereon outwardly with respect to said connector card-receiving slot and, wherein when said actuator occupies said second operative position, said opening force is released from said springlet spring arm portions.

5. The connector as defined in claim 1, wherein said each of said two spring arm portions are interconnected to their associated springlet base portions by first and second beams.

6. The connector as defined in claim 1, wherein said electrical contacts include extents of flexible circuitry, and said first and second conductive portions of said contacts are disposed near opposite ends of said flexible circuitry extents.

7. The connector as defined in claim 5, wherein said first beams interconnect said spring arm upper lobes to said springlet base portions and said second beams interconnect said spring arm lower lobes to said springlet base portions.

8. The connector as defined in claim 7, wherein said first and second beams are spaced apart from each other in a direction transverse to said card-receiving slot.

9. The connector as defined in claim 4, wherein said actuator includes a cam that engages a portion of said central passage when said actuator is in said second operative position, said spring arm portions riding on said cam when said actuator is in said first operative position.

10. The connector as defined in claim 1, wherein said contacts include extents of flexible circuitry having first and second opposing ends, said spring arm portion including slots formed therein that engage said flexible circuitry first ends and said connector having a base plate that engages said flexible circuitry second ends, said contact first conductive portions being disposed on said flexible circuitry near said first ends thereof in opposition to said circuit card faces when said circuit card is inserted into said card-receiving slot, and said second conductive portions being disposed on said flexible circuitry near said second ends thereof in opposition to said circuit board mounting surface when said connector is mounted to said circuit board.

11. The connector as defined in claim 1, further including an elongated retainer base, each of said springlets being at least partially supported in their extent between said connector end portions by said retainer base.

12. The connector as defined in claim 11, wherein said retainer base includes a channel member having two flanges interconnected by a central web, said retainer base web partially supporting said springlet via their base portions and said retainer base flanges aligning said springlets together lengthwise of said spring assembly.

13. The connector as defined in claim 1, wherein said upper and lower spring lobe portions project into said card-receiving slot, said lower spring portions projecting a greater distance into said card-receiving slot than said upper spring lobe portions.

14. A flexible printed circuit card connector for providing an electrical connection between a plurality of first contacts on a primary circuit board and a plurality of second contacts on a secondary circuit card having an edge that is insertable into and removable from said connector, said circuit card having first and second opposing circuit surfaces, at least one of said first and second circuit surfaces having said second contacts disposed thereon, said connector comprising: a connector housing including two opposing end portions that define a length of said connector, a contact spring assembly extending between said connector end portions, said contact spring assembly having a card-receiving slot that is adapted to receive said circuit card edge therein, said connector further including flexible circuitry extending lengthwise along said connector between said connector end portions and on opposite sides of a centerline of said card-receiving slot, said flexible circuitry being supported upon said contact spring assembly in partial overlying relationship therewith, said flexible circuitry including a plurality of first conductive portions disposed thereon in spaced-apart order lengthwise along opposite sides of said card-receiving slot centerline, said contact spring assembly being made up of a plurality of discrete, individual spring elements, each spring element having a predetermined incremental length, each of said spring element having a base portion and two spring arm portions extending from the base portion and disposed on opposite sides of the card-receiving slot centerline and biased towards said card-receiving slot such that when said circuit card is inserted into said card-receiving slot, said spring arm portions of said discrete spring elements springingly engage said circuit card and apply a plurality of discrete contact forces to said circuit card to bring and maintain said flexible circuitry first conductive portions in electrical contact with said circuit card second contacts, each of said discrete contact forces being applied within said spring element discrete lengths, said connector further including a base member extending between said connector end portions, said base member including a channel having two spaced-apart flanges extending therefrom that define an interior space of said base member that receives said spring element base portions therein, said channel flanges at least partially aligning said spring elements with each other along the length of said connector.

15. The connector as defined in claim 14, wherein each of said spring elements further includes a body portion supporting said spring arm portions.

16. The connector as defined in claim 15, wherein said two spring arm portions are interconnected to said spring element body portions by a pair of beam members.

17. The connector as defined in claim 15, wherein two spring arm portions are interconnected to said spring element body portions by respective pairs of first and second beam members.

18. The connector as defined in claim 14, wherein said two spring arm portions each include upper and lower spring lobe portions that are vertically spaced apart from each other with respect to said card-receiving slot.

19. The connector as defined in claim 18, wherein said two spring arm portions of each spring element are interconnected to a spring element body portion by pairs of first and second beam members, said first beam members interconnecting said upper spring lobes with said spring element body portions and said second beam members interconnecting said lower spring lobes with said spring element body portions.

20. The connector as defined in claim 18, wherein said upper and lower spring lobe portions project into said card-receiving slot, said lower spring portions projecting a greater distance into said card-receiving slot than said upper spring lobe portions.

21. The connector as defined in claim 18, further including a pair of clips that engage said lower spring lobe portions and confront said card-receiving slot to prevent abrasion of said circuit card edge by said lower spring lobe portions due to insertion and removal thereof.

22. The connects as defined in claim 21, wherein said clips extend for the length of said contact spring assembly.

23. The connector as defined in claim 14, wherein each of said spring elements includes a body portion disposed between said spring arm portions and said connector further includes an elongated actuating member extending along said spring element body portions for the length of said contact spring assembly, said actuating member being movable between first and second operative positions wherein in said first operative position, said actuating member forces said spring arm portions outwardly with respect to said card-receiving slot into open positions that permit easy insertion of said circuit card into said card-receiving slot and wherein in said second operative position, said actuating member releases said spring arm portions from said open positions.

24. The connector as defined in claim 23, wherein said spring element body portions include a passage formed thereon that receives said actuating member therein.

25. The connector as defined in claim 24, wherein said spring arm portions are interconnected to said spring element body portion by respective beam members, said beam members being disposed exterior of said spring element body portions.

26. The connector as defined in claim 14, wherein said spring arm portions apply normal forces against said circuit card first and second circuit surfaces.

27. A connector assembly for electrically interconnecting a first printed circuit board having electrical contacts thereon to a second printed circuit board having electrical contacts thereon, comprising:

an elongated support assembly for being positioned on the first printed circuit board, said support assembly including a plurality of substantially identical, discrete resilient support members, the discrete support members being generally U-shaped as seen from an end of said support members, each discrete support member having a body portion and two arm portions that extend from the body portion, the support member spring arms being spaced apart to define a longitudinal opening therebetween for receiving a portion of said second printed circuit board therein; said discrete support members being arranged in longitudinal fashion to cooperatively define a length of said support assembly, said longitudinal openings cooperating to define a second circuit board-receiving opening extending longitudinally through said support assembly, each of said discrete support member body portions including a central opening disposed therein that communicates with each of said spring arm portions;

flexible circuitry mounted on said support assembly, said flexible circuitry including a plurality of spaced-apart electrical conductors being electrically connected with the electrical contacts of said first printed circuit board when said connector assembly is mounted to said first printed circuit board, said electrical conductors having respective conductive portions associated therewith, said flexible circuitry being positioned on said support assembly such that said conductive portions are positioned on said discrete support member arm portions on at least one side of said longitudinal openings thereof and of said second circuit board-receiving opening to provide an electrical connection with the electrical contacts on said second printed circuit board when said second printed circuit board is received within said support assembly and said discrete support member longitudinal openings;

an actuator positioned in and extending through said discrete support member body portion central openings, said actuator being operable between first and second positions wherein when said actuator is in said first position, said actuator engages said discrete support member spring arms and exerts a force on them to spread them outwardly with respect to each other to increase the size of said longitudinal openings to thereby permit insertion therein of said second printed circuit board with substantially zero insertion force; and, whereby each of said support members individually applies a discrete contact force to said second printed circuit board along the length of said second printed circuit board.

28. The connector assembly of claim 27, wherein said discrete support member spring arms are spaced apart a distance less than a thickness of said printed circuit board.

29. The connector assembly of claim 27, wherein said actuator has an eccentric configuration.

30. A connector assembly for electrically interconnecting a first printed circuit board having electrical contacts thereon to a second printed circuit card having electrical contacts thereon, comprising:

an elongated spring assembly for being positioned on the first printed circuit board, said spring assembly including a plurality of substantially identical, discrete resilient support springs arranged lengthwise along a base member, the discrete support springs being further disposed on the base member spaced apart from each other to thereby define a longitudinal opening therebetween, the longitudinal openings between said support springs cooperatively forming a card-receiving slot along a length of said spring assembly for receiving a portion of said second printed circuit card therein; flexible circuitry mounted on said spring assembly, the flexible circuitry including a plurality of spaced-apart electrical conductors that are electrically connected with the electrical contacts of said first printed circuit board when said connector is mounted to said first printed circuit board, said electrical conductors having discrete conductive portions associated therewith, said flexible circuitry being positioned on said spring assembly such that said conductive portions are positioned on at least one side of said card-receiving slot to thereby provide an electrical connection with the electrical contacts on said second printed circuit card when said second printed circuit card is inserted into said card-receiving slot and received within said spring assembly discrete spring member longitudinal openings; said support springs having distinct upper and lower card-contacting portions that contact different portions of said circuit card when inserted into said card-receiving slot, the support spring upper and lower card-contacting portions of said individual support springs confronting each other on opposite sides of said card-receiving slot; and, whereby each of said spring members individually applies a discrete contact force through their respective upper and lower card-contacting portions to said second printed circuit card.

31. The connector as set forth in claim 30, wherein said discrete support springs are fashioned from resilient flat wire.

32. The connector as set forth in claim 30, wherein said discrete support springs include a pair of elongated spring elements extending the length of said spring assembly, said spring elements including opposing bases and free ends, said spring element bases engaging said connector assembly base member to support said free ends in a cantilevered fashion, each of said spring element free ends having a plurality of discrete springlets formed thereon, adjacent springlets being separated by intervening spaces to permit each said springlet to move independently with respect to each other, each discrete springlet supporting a like extent of said flexible circuitry.

33. The connector as set forth in claim 32, wherein said springlets are formed on said spring element free ends by stamping.

34. An electrical connector for effecting a connection between a plurality of first circuits disposed on a mounting surface of a circuit board and a plurality of second circuits on a circuit card, the circuit card having two circuit faces disposed on opposite sides of said circuit card, at least one of said circuit card faces including a plurality of individual contact areas arranged in a predetermined pattern, the contact areas forming portions of said circuit card second circuits, the connector having improved card-engagement characteristics, said connector comprising:

two opposing connector end portions, a spring assembly extending lengthwise between the connector end portions, a base member extending the length of the spring assembly for retaining said spring assembly in place within said connector, said spring assembly having a slot for receiving the circuit card therein, a plurality of electrically conductive contacts disposed on opposite sides of the card-receiving slot and supported by said spring assembly, the contacts having first conductive portions disposed thereon and extending within said card-receiving slot and second conductive portions extending proximate to said circuit board first circuits when said connector is installed upon said circuit board, said spring assembly including a plurality of discrete, resilient springlets arranged in side-by-side order and extending along a length of said spring assembly, each of the springlets having a discrete length and further including a base portion and two spring arm portions, the spring arm portions extending from said springlet base portion and being spaced apart from each other to cooperatively define a portion of said card-receiving slot therebetween, said spring arm portions each supporting respective first conductive portions on opposite sides of said card-receiving slot, each of said springlets further independently exerting a biasing force on said respective first conductive portions to thereby urge said first conductive portions of said contacts toward said card-receiving slot and into contact with said circuit card contact areas when said circuit card is inserted into said card slot, said springlets being at least partially supported in their extent between said connector end portions by said base member, said base member having flange portions associated therewith that said springlets together lengthwise of said spring assembly.

35. A flexible printed circuit card connector for providing an electrical connection between a plurality of first contacts on a primary circuit board and a plurality of second contacts on a secondary circuit card having an edge that is insertable into and removable from said connector, said circuit card having first and second opposing circuit surfaces, at least one of said first and second circuit surfaces having said second contacts disposed thereon, said connector comprising: a connector housing having a predetermined length, a contact spring assembly extending for at least a portion of said connector housing length, said contact spring assembly having a card-receiving slot that is adapted to receive said circuit card edge therein, said connector further including flexible circuitry extending lengthwise along said connector on opposite sides of a centerline of said card-receiving slot, the flexible circuitry being supported upon said contact spring assembly and said flexible circuitry including a plurality of first conductive portions disposed thereon in spaced-apart order lengthwise along opposite sides of said card-receiving slot centerline, said contact spring assembly being made up of a plurality of discrete, individual spring elements, each spring element having a body portion of predetermined incremental length, each of said spring element having two spring arm portions disposed on opposite sides of the body portion and card-receiving slot centerline and biased towards said card-receiving slot such that when said circuit card is inserted into said card-receiving slot, said spring arm portions of said discrete spring elements springingly engage said circuit card and apply a plurality of discrete contact forces to said circuit card to bring and maintain said flexible circuitry first conductive portions in electrical contact with said circuit card second contacts, and an actuating member extending along said spring element body portions for the length of said contact spring assembly, said actuating member being movable between first and second operative positions wherein in said first operative position, said actuating member forces said spring arm portions outwardly with respect to said card-receiving slot into open positions that permit easy insertion of said circuit card into said card-receiving slot and wherein in said second operative position, said actuating member releases said spring arm portions from said open positions.

\* \* \* \* \*